United States Patent [19]

Inoue et al.

[11] Patent Number: 4,809,275
[45] Date of Patent: Feb. 28, 1989

[54] PARITY SIGNAL GENERATING CIRCUIT

[75] Inventors: Yasuo Inoue, Kawasaki; Yasuhiro Yamada, Fussa, both of Japan

[73] Assignee: Victor Company of Japan Ltd., Yokohama, Japan

[21] Appl. No.: 5,744

[22] Filed: Jan. 21, 1987

[30] Foreign Application Priority Data

Feb. 4, 1986 [JP] Japan .................. 61-22616

[51] Int. Cl.$^4$ .................... G06F 11/10
[52] U.S. Cl. .................... 371/37; 371/40
[58] Field of Search ............ 371/39, 38, 37, 40

[56] References Cited

U.S. PATENT DOCUMENTS

| | | | |
|---|---|---|---|
| 4,583,223 | 4/1986 | Yamada | 371/37 |
| 4,627,058 | 12/1986 | Moriyama | 371/37 |
| 4,646,301 | 2/1987 | Okamoto | 371/37 |
| 4,646,303 | 2/1987 | Narusawa | 371/37 |
| 4,675,869 | 6/1987 | Driessen | 371/37 |

FOREIGN PATENT DOCUMENTS 60178717  5/1986  Japan .
22616  1/1987  Japan .

OTHER PUBLICATIONS

"Error Correcting Codes" W. W. Peterson & E. J. Weldon.
Blahut, Richard E., "Theory and Practice of Error Control Codes", Addison-Wesley, 1983, pp. 96-100.

Primary Examiner—Michael R. Fleming
Attorney, Agent, or Firm—Ladas & Parry

[57] ABSTRACT

A parity generating circuit comprises first and second dividing circuits and an output circuit. Each element of a row matrix $W_0'$ described by $W_0' = [D_1, D_2, \ldots, D_i, 0, \ldots 0, D_j, \ldots, D_n]$ in which $(n-k)$ m-bit parities $P_{i+1}$ through $P_{j-1}$ of a row matrix $W_0$ described by $W_0 = [D_1, D_2, \ldots, D_i, P_{i+1}, \ldots, P_{j-1}, D_j, \ldots, D_n]$ and describing a Reed Solomon code are zero vectors is applied to an input terminal and is supplied to the first dividing circuit wherein dividing steps are carried out, where $D_1$ through $D_i$ and $D_j$ through $D_n$ denote k m-bit data and $n-k=j-i-1$, $2^m-1 \geq n$ and $n > j > i$. The second dividing circuit uses divided results from the first dividing circuit as initial values and carries out dividing steps with the input elements made "0". The output circuit outputs $(n-k)$ divided results from the second dividing circuit as the parities $P_{i+1}$ through $P_{-1}$.

6 Claims, 5 Drawing Sheets

PARITY SIGNAL GENERATING CIRCUIT

BACKGROUND OF THE INVENTION

The present invention generally relates to parity generating circuits, and more particularly to a parity generating circuit for generating parities of a Reed Solomon code.

When carrying out data transmission such as in data communication, PCM recording and reproducing apparatuses, digital audio discs and the like, an error correction is conventionally carried out so as to correctly restore the transmitted data. In order to carry out such an error correction, parities (check vectors) which are generated according to a predetermined method are added to the data which are to be transmitted so as to constitute blocks, and the signal transmission or recording is carried out in such blocks. A code error in the blocks which are received or reproduced is corrected by use of the parities.

Various kinds of error correction codes comprising the parities and the data which are to be transmitted and are also generating elements of the parities are known. Out of the known error correction codes, the Reed Solomon code is popularly used because of its superior error correction capability and the redundancy of the transmitted information (that is, the ratio between the parities and the data in the block).

First, description will be given with respect to the general principle of generating the Reed Solomon code. A Reed Solomon code having a code word (block) with a word length n, k data (data vectors) which are to be transmitted, and (n−k) parities (check vectors) is often referred to as a (n, k) Reed Solomon code, where n and k are natural numbers. The code word of this (n, k) Reed Solomon code can be described by the following row matrix W of equation (1), where $C_1$ through $C_n$ are data or parity and there are at least one data and one parity.

$$W = [C_1, C_2, \ldots, C_n] \quad (1)$$

In addition, $C_1$ through $C_n$ are m-bit vectors, respectively, and are elements in a Galois Field $GF(2^m)$ in the Reed Solomon code defined in $GF(2^m)$. It is known that the following condition (2) must be satisfied between m and n.

$$2^m - 1 \geq n \quad (2)$$

When a check matrix $H_0$ is assumed to be a (n−k) row by n column matrix described by the following equation (3), where $\alpha$ denotes a primitive element of $GF(2^m)$, the parities are generated so that a syndrome S described by the following equation (4) can be described as a column matrix comprising (n−k) zero vectors, where T in equation (4) denotes a transposed matrix.

$$(3)$$

-continued $$H_0 = \begin{pmatrix} 1, & , 1 & , \ldots, 1 & , 1 \\ \alpha^{n-1} & , \alpha^{n-2} & , \ldots, \alpha & , 1 \\ \alpha^{2(n-1)} & , \alpha^{2(n-2)} & , \ldots, \alpha^2 & , 1 \\ \cdot & \cdot & & \cdot & \cdot \\ \cdot & \cdot & & \cdot & \cdot \\ \cdot & \cdot & & \cdot & \cdot \\ \alpha^{(n-k-1)(n-1)}, & \alpha^{(n-k-1)(n-2)}, & \ldots, & \alpha^{n-k-1}, & 1 \end{pmatrix}$$

A parity generating polynomial G(x) of the (n, k) Reed Solomon code of the code word W described by the following equation (5) can be described by the following equation (6), where $D_1$ through $D_k$ denote data and $P_{k+1}$ through $P_n$ denote parities in the equation (5).

$$W = [D_1, D_2, \ldots, D_k, P_{k+1}, P_{k+2}, \ldots, P_n] \quad (5)$$

$$G(x) = (x-1)\cdot(x-\alpha)\cdot(x-\alpha^2)\cdot \ldots \cdot(x-\alpha^{n-k-1}) \quad (6)$$

The following equation (7) can be obtained by expanding the equation (6), where $a_1$ through $a_{n-k}$ are coefficients which can be described by the primitive $$G(x) = x^{n-k} + a_1 \cdot x^{n-k-1} + a_2 \cdot x^{n-k-2} + a_{n-k-1}\cdot x + a_{n-k} \quad (7)$$

When the data $[D_1, D_2, \ldots, D_k]$ within the code word W are used to define a polynomial $F_D(x)$ which is described by the following equation (8), a remainder polynomial R(x) which is obtained when the polynomial $F_D(x)$ is divided by the parity generating polynomial G(x) can be described by the following equation (9).

$$F_D(x) = D_1 \cdot x^{n-1} + D_2 \cdot x^{n-2} + \ldots + D_k \cdot x^{n-k} \quad (8)$$

$$R(x) = R_1 \cdot x^{n-k-1} + R_2 \cdot x^{n-k-2} + \ldots + R_{n-k-1}\cdot x + R_{n-k} \quad (9)$$

A product F(x) of the quotient in this case and the parity generating polynomial G(x) can be described by $F(x) = F_D(x) - R(x)$, but this subtraction is a modulo-2 subtraction which is the same as a modulo-2 addition. Accordingly, the product F(x) can be described by $F(x) = F_D(x) + R(x)$, and the product F(x) described by the following equation (10) is divisible by the parity generating polynomial G(x).

$$\begin{aligned} F(x) &= F_D(x) + R(x) \\ &= D_1 \cdot x^{n-1} + D_2 \cdot x^{n-2} + \ldots + D_k \cdot x^{n-k} + R_1 \cdot x^{n-k-1} + R_2 \cdot x^{n-k-2} + \ldots + R_{n-k-1} \cdot x + R_{n-k} \end{aligned} \quad (10)$$

Accordingly, from the equation (10), it can be seen that the parities $P_{k+1}$ and $P_{k+2}, \ldots, P_n$ in the Reed Solomon code described by the equation (5) can be described by the following set of equations (11).

$$P_{k+1} = R_1$$
$$P_{k+2} = R_2$$
$$\vdots \quad \vdots$$
$$P_n = R_{n-k}$$
(11)

There are conventional circuits for generating the parities of the Reed Solomon code according to the generating principle described heretofore. In first and second easily conceivable circuits which will be described later on in the present specification in conjunction with the drawings, when the code word $W_0$ consists of parities $P_{i+1}$ through $P_{j-1}$ and data $D_0$ through $D_i$ and data $D_j$ through $D_n$ comprising the elements of $GF(2^m)$ as described by the following equation (12), there is a problem in that the parities $P_{i+1}$ through $P_{j-1}$ cannot be generated for a code word $W_0$ in which the parities $P_{i+1}$ through $P_{j-1}$ are between the data $D_1$ through $D_i$ and the data $D_j$ through $D_n$. In the equation (12), $n-k=j-i-1$ and $n>j>i$.

$$W_0 = [D_1, D_2, \ldots, D_i, P_{i+1}, \ldots, P_{j-1}, D_j, \ldots, D_n] \quad (12)$$

As will be described later on in the present specification in conjunction with the drawings, there is a third easily conceivable circuit for generating the parities by use of a parity generating matrix and a fourth easily conceivable circuit for generating the parites by use of simultaneous equations, even when the code word $W_0$ is described by the equation (12) and the parities $P_{i+1}$ through $P_{j-1}$ are between the data $D_1$ through $D_i$ and the data $D_j$ through $D_n$.

However, according to the third conceivable circuit, there is are problems in that a read only memory (ROM) must be used to store each element of the parity generating polynomial because the parity generating matrix has no regularity, and each coefficient multiplier of the third conceivable circuit must be constructed so that it is possible to multiply any kind of coefficient since the coefficients from the ROM successively change depending on the input data. As a result, the scale of the third conceivable circuit as a whole becomes large and the circuit is expensive.

On the other hand, each coefficient multiplier of the fourth conceivable circuit always multiplies a constant coefficient to an input signal, and the construction of the coefficient multiplier can be simplified compared to that of the third conceivable circuit. However, there is a problem in that when substitutions are made into the simultaneous equations so as to generate the parities $P_{i+1}$ through $P_{j-1}$, it is necessary to carry out an extremely large number of operation steps by use of an arithmetic logic unit (ALU), for example.

SUMMARY OF THE INVENTION

Accordingly, it is a general object of the present invention to provide a novel and useful parity generating circuit in which the problems described heretofore are eliminated.

Another and more specific object of the present invention is to provide a parity generating circuit for generating parities $P_{i+1}, \ldots, P_{j-1}$ of a Reed Solomon code described by a row matrix $W_0 = [D_1, D_2, \ldots, D_i, P_{i+1}, \ldots, P_{j-1}, D_j, \ldots, D_n]$, where $D_1$ through $D_i$ and $D_j$ through $D_n$ denote k m-bit data and $P_{i+1}$ through $P_{j-1}$ denote $(n-k)$ m-bit parities, $n-k=j-i-1$, $2^m-1 \geq n$, $n>j>i$, and the parity generating circuit comprises first dividing means successively supplied with elements $D_1, D_2, \ldots, D_n$ of a row matrix $W_0'$ in this sequence for carrying out n dividing steps by a parity generating polynomial $G(x)$, where the row matrix $W_0'$ is equal to the row matrix $W_0$ with the parities $P_{i+1}$ through $P_{j-1}$ thereof set to zero vectors so that $W_0' = [D_1, D_2, \ldots, D_i, 0, \ldots, 0, D_j, \ldots, D_n]$, the parity generating polynomial $G(x)$ is described by $$\begin{aligned} G(x) &= (x-1) \cdot (x-\alpha) \cdot \ldots \cdot (x-\alpha^{n-k-1}) \\ &= x^{n-k} + a_1 \cdot x^{n-k-1} + a_2 \cdot x^{n-k-2} + \ldots + \\ &\quad a_{n-k-1} \cdot x + a_{n-k}, \end{aligned}$$

$\alpha$ is a primitive element of Galois Field $GF(2^m)$ and $a_1$ through $a_{n-k}$ are constants, second dividing means for carrying out $(n-j+1)$ dividing steps by a reciprocal polynomial $G^*(x)$ of the parity generating polynomial $G(x)$ by using divided results (remainders) obtained in the first dividing means as initial values and having input elements thereof set to zero, where the reciprocal polynomial $G^*(x)$ is described by $$G^*(x) = a_{n-k} \cdot x^{n-k} + a_{n-k-1} \cdot x^{n-k-1} + \ldots + a_1 \cdot x + 1,$$

and output means for outputting $(n-k)$ divided results (remainders) obtained in the second dividing means as the parities $P_{i+1}$ through $P_{j-1}$. According to the parity generating circuit of the present invention, when generating the parities of a $(n, k)$ Reed Solomon code, multipliers of the parity generating circuit simply need to multiply constant multiplying coefficients, there is no need to provide a memory for storing a large number of multiplying coefficients, and it is possible to generate the parities by carrying out operation steps which are much less compared to the operation steps which are required when using an arithmetic logic unit (ALU), for example. As a result, the parity generating circuit of the present invention has a simple circuit construction and is inexpensive.

Still another object of the present invention is to provide a parity generating circuit for generating parities $P_{i+1}, \ldots, P_{j-1}$ of a Reed Solomon code described by a row matrix $W_0 = [D_1, D_2, \ldots, D_i, P_{i+1}, \ldots, P_{j-1}, D_j, \ldots, D_n]$, where $D_1$ through $D_i$ and $D_j$ through $D_n$ denote k m-bit data and $P_{i+1}$ through $P_{j-1}$ denote $(n-k)$ m-bit parities, $n-k=j-i-1$, $2^m-1 \geq n$, $n>j>i$, and the parity generating circuit comprises first dividing means successively supplied with elements $D_n, \ldots, D_j, 0, \ldots, 0, D_i, \ldots, D_2, D_1$ of a row matrix $W_0'$ in this sequence for carrying out n dividing steps by a reciprocal polynomial $G^*(x)$ of a parity generating polynomial $G(x)$, where the row matrix $W_0'$ is equal to the row matrix $W_0$ with the parities $P_{i+1}$ through $P_{j-1}$ thereof set to zero vectors so that $W_0' = [D_1, D_2, \ldots, D_i, 0, \ldots, 0, D_j, \ldots, D_n]$, the parity generating polynomial $G(x)$ is described by $$\begin{aligned} G(x) &= (x-1) \cdot (x-\alpha) \cdot \ldots \cdot (x-\alpha^{n-k-1}) \\ &= x^{n-k} + a_1 \cdot x^{n-k-1} + a_2 \cdot x^{n-k-2} + \ldots + \\ &\quad a_{n-k-1} \cdot x + a_{n-k}, \end{aligned}$$

$\alpha$ is a primitive element of Galois Field GF($2^m$), $a_1$ through $a_{n-k}$ are constants and the reciprocal polynomial G*(x) is described by $$G^*(x) = a_{n-k} \cdot x^{n-k} + a_{n-k-1} \cdot x^{n-k-1} + \ldots + a_1 \cdot x + 1,$$

second dividing means for carrying out i dividing steps by the parity generating polynomial G(x) by using divided results (remainders) obtained in the first dividing means as initial values and having input elements thereof set to zero, and output means for outputting (n−k) divided results (remainders) obtained in the second dividing means as the parities $P_{i+1}$ through $P_{j-1}$. According to the parity generating circuit of the present invention, when generating the parities of a (n, k) Reed Solomon code, multipliers of the parity generating circuit simply need to multiply constant multiplying coefficients, there is no need to provide a memory for storing a large number of multiplying coefficients, and it is possible to generate the parities by carrying out operation steps which are much less compared to the operation steps which are required when using an arithmetic logic unit (ALU), for example. As a result, the parity generating circuit of the present invention has a simple circuit construction and is inexpensive.

Other objects and further features of the present invention will be apparent from the following detailed description when read in conjunction with the accompanying drawings.

DETAILED DESCRIPTION

First, description will be given with respect to first through fourth examples of the easily conceivable parity generating circuit so as to facilitate the understanding of the present invention.

Figure 1:
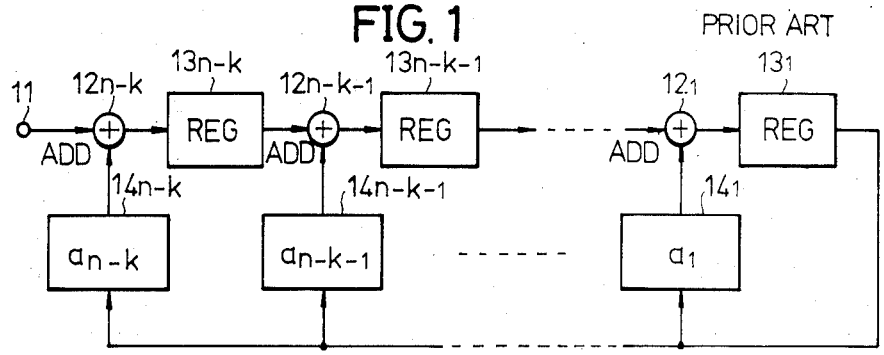
FIGS. 1 through 4 are block diagrams respectively showing first through fourth examples of the easily conceivable parity generating circuit.
Figure 2:
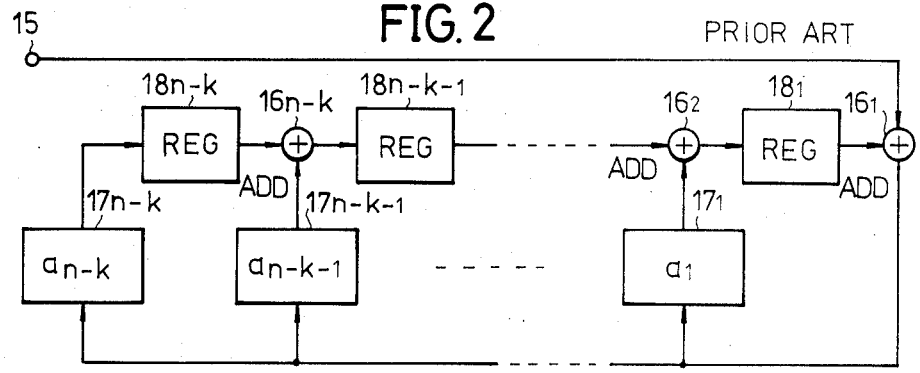

The first and second conceivable parity generating circuits respectively shown in FIGS. 1 and 2 generate the parities according to the generating principle described before up to the equation (11). In the first parity generating circuit shown in FIG. 1, after registers $13_1$ through $13_{n-k}$ are first cleared, a code word in which (n−k) parities $P_{k+1}$ through $P_n$ of the code word W described by the equation (5) are zero vectors are applied serially to an input terminal 11 in a sequence of the data $D_1$, $D_2$, $D_3$, ..., $D_k$, and (n−k) zero vectors are then successively applied to the input terminal 11. The input vectors are transferred serially through an adder $12_{n-k}$, the register $13_{n-k}$, an adder $12_{n-k-1}$, the register $13_{n-k-1}$, ..., and the register $13_1$ in this sequence.

An output signal of the register $13_1$ in the last stage is supplied to coefficient multipliers $14_1$, $14_2$, ..., $14_{n-k-1}$ and $14_{n-k}$ for multiplying the coefficients $a_1$, $a_2$, ..., $a_{n-k-1}$ and $a_{n-k}$ of the equation (7), respectively. Output signals of the multipliers $14_1$ through $14_{n-k}$ are independently supplied to the corresponding adders $12_1$ through $12_{n-k}$.

The input vectors are m-bit vectors and are elements of GF($2^m$), which means that the input vectors are also m-dimension vectors in GF($2^m$). Accordingly, the multipliers $14_1$ through $14_{n-k}$ are multipliers in GF($2^m$), and the adders $12_1$ through $12_{n-k}$ are modulo-2 adders for carrying out a modulo-2 addition of the m-bit signals (vectors) from the multipliers $14_1$ through $14_{n-k}$ and the m-bit signals (vectors) from the registers $13_2$ through $13_{n-k}$ and the input terminal 11 for each corresponding bit.

At a point in time when k data and (n−k) parities (zero vectors in this case) have all been applied serially to the input terminal 11, the terms $R_1$, ..., $R_{n-k-1}$ and $R_{n-k}$ of the remainder polynomial R(x) described by the equation (10) are stored and remain in the (n−k) registers $13_1$, ..., $13_{n-k-1}$ and $13_{n-k}$, respectively. Hence, the parities can be generated by successively reading out the values in the registers $13_1$ through $13_{n-k}$.

On the other hand, in the second parity generating circuit shown in FIG. 2, after all of registers $18_1$ through $18_{n-k}$ are cleared, only the data [$D_1$, $D_2$, ..., $D_k$] are applied serially to an input terminal 15 and are supplied to (n−k) coefficient multipliers $17_1$, ..., $17_{n-k-1}$ and $17_{n-k}$ via an adder $16_1$. The multipliers $17_1$, ..., $17_{n-k-1}$ and $17_{n-k}$ multiply to the output signal of the adder $16_1$ the coefficients $a_1$, ..., $a_{n-k-1}$ and $a_{n-k}$ of the equation (7), respectively. Output signals of the multipliers $17_1$ through $17_{n-k-1}$ are independently supplied to corresponding adders $16_2$ through $16_{n-k}$ which are respectively provided in the input stages of the registers $18_1$ through $18_{n-k-1}$. An output signal of the multiplier $17_{n-k}$ is supplied to the register $18_{n-k}$. Output signals of the registers $18_2$ through $18_{n-k}$ are supplied to the corresponding adders $16_2$ through $16_{n-k}$, and an output signal of the adder $16_2$ is supplied to the register $18_1$.

When the last data $D_k$ is applied to the input terminal 15 and after the last data $D_k$ is entered into the registers $18_1$ through $18_{n-k}$ via the adder $16_1$, the multipliers $17_1$ through $17_{n-k}$ and the adders $16_2$ through $16_{n-k}$, the parities can be generated by reading out the stored values (register values) from the registers $18_1$ through $18_{n-k}$. Since only the data $D_1$ through $D_k$ need to be applied to the input terminal 15, the division is only required k times and the parities can be generated within a shorter time compared to the first parity generating circuit shown in FIG. 1 requiring n divisions.

However, as described before, in the first and second parity generating circuits, when the code word $W_0$ consists of parities $P_{i+1}$ through $P_{j-1}$ and data $D_0$ through $D_i$ and data $D_j$ through $D_n$ comprising the elements of GF($2^m$) as described by the equation (12), there is a problem in that the parities $P_{i+1}$ through $P_{j-1}$ cannot be generated for a code word $W_0$ in which the parities $P_{i+1}$ through $P_{j-1}$ are between the data $D_1$ through $D_i$ and the data $D_j$ through $D_n$.

There is a third conceivable parity generating circuit for generating the parities by use of a parity generating matrix and a fourth conceivable parity generating circuit for generating the parities by use of simultaneous equations, even when the code word $W_0$ is described by the equation (12) and the parities $P_{i+1}$ through $P_{j-1}$ are between the data $D_1$ through $D_i$ and the data $D_j$ through $D_n$. First, description will be given with respect to the third parity generating circuit. A parity generating polynomial can be obtained by transformation of the check matrix $H_0$ described before. By adding a certain row vector to another row vector in the check matrix $H_0$ described by the equation (3) and carrying out such an addition (matrix transformation) several times, a (i+1)th column to a (j−1)th column are transformed into a unit matrix. A matrix $H_0'$ obtained by such a matrix transformation can be described by the following equation (13), where $a_{1,1}$ through $a_{n-k,n}$ are elements of the matrix and can be described by the primitive element $\alpha$.

$$H_0' = \begin{pmatrix} a_{1,1} & a_{1,2} & \cdots & a_{1,i} & 1 & 0 & \cdots & 0 & a_{1,j} & \cdots & a_{1,n} \\ a_{2,1} & a_{2,2} & \cdots & a_{2,i} & 0 & 1 & \cdots & 0 & a_{2,j} & \cdots & a_{2,n} \\ \cdot & \cdot & & \cdot & & & & & \cdot & & \cdot \\ \cdot & \cdot & & \cdot & & & & & \cdot & & \cdot \\ \cdot & \cdot & & \cdot & & & & & \cdot & & \cdot \\ a_{n-k,1} & a_{n-k,2} & \cdots & a_{n-k,i} & 0 & 0 & \cdots & 1 & a_{n-k,j} & \cdots & a_{n-k,n} \end{pmatrix} \quad (13)$$

The matrix $H_0'$ is also a check matrix and satisfies the following equation (14), where there are (n−k) "0"s.

$$H_0' \cdot W_0^T = [0, 0, \ldots, 0]^T \quad (14)$$

The equation (14) can be described as the following set of equations (15).

$$\left. \begin{array}{l} a_{1,1} \cdot D_1 + a_{1,2} \cdot D_2 + \ldots + a_{1,i} \cdot D_i + P_{i+1} + a_{1,j} \cdot D_j + \\ \ldots + a_{1,n} \cdot D_n = 0 \\ a_{2,1} \cdot D_1 + a_{2,2} \cdot D_2 + \ldots + a_{2,i} \cdot D_i + P_{i+2} + a_{2,j} \cdot D_j + \\ \ldots + a_{2,n} \cdot D_n = 0 \\ \cdot \\ \cdot \\ \cdot \\ a_{n-k,1} \cdot D_1 + a_{n-k,2} \cdot D_2 + \ldots + a_{n-k,i} \cdot D_i + P_{j-1} + \\ a_{n-k,j} \cdot D_j + \ldots + a_{n-k,n} \cdot D_n = 0 \end{array} \right\} \quad (15)$$

The following equation described in matrix form can be obtained from the set of equations (15) when solved for $P_{i+1}$ through $P_{j-1}$.

$$\begin{pmatrix} P_{i+1} \\ P_{i+2} \\ \cdot \\ \cdot \\ \cdot \\ P_{j-1} \end{pmatrix} = \begin{pmatrix} a_{1,1} & a_{1,2} & \cdots & a_{1,i} & a_{1,j} & \cdots & a_{1,n} \\ a_{2,1} & a_{2,2} & \cdots & a_{2,i} & a_{2,j} & \cdots & a_{2,n} \\ \cdot & \cdot & & \cdot & \cdot & & \cdot \\ \cdot & \cdot & & \cdot & \cdot & & \cdot \\ \cdot & \cdot & & \cdot & \cdot & & \cdot \\ a_{n-k,1} & a_{n-k,2} & \cdots & a_{n-k,i} & a_{n-k,j} & \cdots & a_{n-k,n} \end{pmatrix} \cdot \begin{pmatrix} D_1 \\ D_2 \\ \cdot \\ \cdot \\ D_i \\ D_j \\ \cdot \\ \cdot \\ D_n \end{pmatrix} \quad (16)$$

When the left term in the equation (16) is denoted by P and the right terms of the equation (16) are denoted by a matrix $H_1$ and a column matrix D, the equation (16) can be written as the following equation (17), and the (n−k) row by k column matrix $H_1$ is the parity generating polynomial.

$$P = H_1 \cdot D \quad (17)$$

Figure 3:
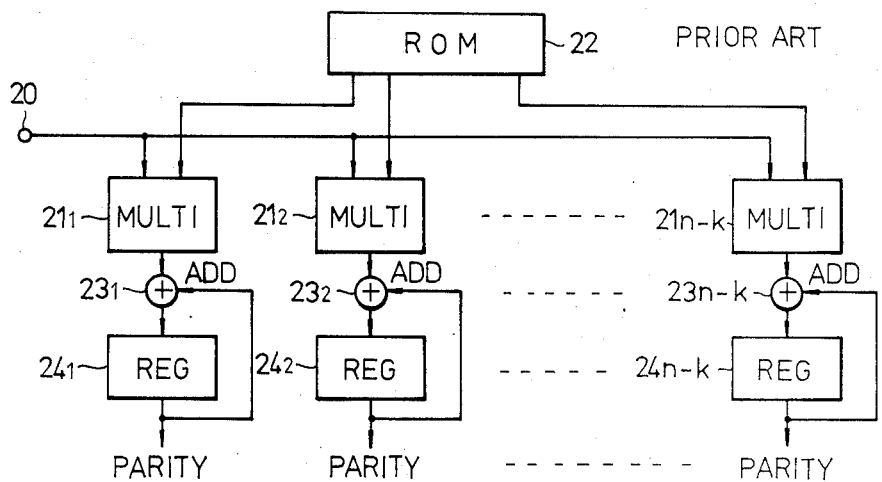

FIG. 3 shows the third parity generating circuit which uses the parity generating matrix $H_1$. Only the data $D_1$ through $D_i$ and $D_j$ through $D_n$ of the code word $W_0$ described by the equation (12) are applied serially to an input terminal 20. The input data are supplied to (n−k) coefficient multipliers $21_1$ through $21_{n-k}$ and are multiplied by predetermined coefficients which are read out from a read only memory (ROM) 22 which prestores (n−k)×k coefficients of the parity generating polynomial $H_1$. Output signals of the multipliers $21_1$ through $21_{n-k}$ are passed through respective adders $23_1$ through $23_{n-k}$ and are supplied to corresponding registers $24_1$ through $24_{n-k}$ and temporarily stored therein. For example, the first input data $D_1$ is multiplied by the (n−k) coefficients $a_{1,1}$ through $a_{n-k,1}$ in the first column of the parity generating matrix $H_1$ read out from the ROM 22 in the respective multipliers $21_1$ through $21_{n-k}$. The next input data $D_2$ is multiplied by the (n−k) coefficients $a_{1,2}$ through $a_{n-k,2}$ in the second column of the parity generating matrix $H_1$ read out from the ROM 22 in the respective multipliers $21_1$ through $21_{n-k}$, and the output signals of the multipliers $21_1$ through $21_{n-k}$ are added with the corresponding previous multiplication results obtained from the registers $24_1$ through $24_{n-k}$ in the respective adders $23_1$ through $23_{n-k}$ and are then stored in the registers $24_1$ through $24_{n-k}$. Thereafter, the multiplications and additions are successively carried out similarly, and the parities $P_{i+1}$, $P_{i+2}, \ldots, P_{j-1}$ generated by the operation of the equation (16) are simultaneously obtained in parallel from the registers $24_1, 24_2, \ldots, 24_{n-k}$.

Next description will be given with respect to the fourth parity generating circuit which uses the simultaneous equations to generate the parities. When a resulting syndrome S of the check operation $H_0 \cdot W_0^T$ is described by the following equation (18), where $S_0$ through $S_{n-k-1}$ are elements of $GF(2^m)$, the following equation (19) is obtained.

$$S = [S_0, S_1, \ldots, S_{n-k-1}]^T \quad (18)$$

$$S = H_0 \cdot W^T \quad (19)$$

The equation (19) can be described as the following set of equations (20).

$$
\begin{aligned}
S_0 &= D_1 + \ldots + D_i + P_{i+1} + \ldots + P_{j-1} + \\
& \quad D_j + \ldots + D_n \\
S_1 &= \alpha^{n-1} \cdot D_1 + \ldots + \alpha^{n-i} \cdot D_i + \alpha^{n-i-1} \cdot \\
& \quad P_{i+1} + \ldots + \alpha^{n-j+1} \cdot P_{j-1} + \alpha^{n-j} \cdot \\
& \quad D_j + \ldots + D_n \\
& \vdots \\
S_{n-k-1} &= \alpha^{(n-k-1)} \cdot D_1 + \ldots + \alpha^{(n-k-1)(n-i)} \cdot D_i + \\
& \quad \alpha^{(n-k-1)(n-i-1)} \cdot P_{i+1} + \ldots + \\
& \quad \alpha^{(n-k-1)(n-j+1)} \cdot P_{j-1} + \alpha^{(n-k-1)(n-j)} \cdot \\
& \quad D_j + \ldots + D_n
\end{aligned}
\quad (20)
$$

When a code word in which the $(n-k)$ parities $P_{i+1}$ through $P_{j-1}$ of the code word $W_0$ described by the equation (12) are zero vectors is denoted by $W_0'$ which is described by the following equation (21), a syndrome $S'$ with respect to the code word $W_0'$ can be described by the following equation (22), where $S_0'$ through $S_{n-k-1}'$ are elements of $GF(2^m)$.

$$W_0' = [D_1, D_2, \ldots, D_i, 0, 0, \ldots, 0, D_j, \ldots, D_n] \quad (21)$$

$$
\begin{aligned}
S' &= [S_0', S_1', \ldots, S_{n-k-1}']^T \\
&= H_0 \cdot W'^T
\end{aligned}
\quad (22)
$$

Hence, the syndrome $S'$ can be written as the following set of equations (23).

$$
\begin{aligned}
S_0' &= D_1 + D_2 + \ldots + D_i + D_j + \ldots + D_n \\
S_1' &= \alpha^{n-1} \cdot D_1 + \alpha^{n-2} \cdot D_2 + \ldots + \alpha^{n-i} \cdot \\
& \quad D_i + \alpha^{n-j} \cdot D_j + \ldots + D_n \\
& \vdots \\
S_{n-k-1}' &= \alpha^{(n-k-1)(n-1)} \cdot D_1 + \alpha^{(n-k-1)(n-2)} \cdot D_2 + \\
& \quad \ldots + \alpha^{(n-k-1)(n-i)} \cdot D_i + \\
& \quad \alpha^{(n-k-1)(n-j)} \cdot D_j + \ldots + D_n
\end{aligned}
\quad (23)
$$

Accordingly, the following set of equations (24) can be obtained from the equations (23) and (20).

$$
\begin{aligned}
P_{i+1} + P_{i+2} + \ldots + P_{j-1} &= S_0' \\
\alpha^{n-i-1} \cdot P_{i+1} + \alpha^{n-i-2} \cdot P_{i+2} + \ldots + \alpha^{n-j+1} \cdot P_{j-1} &= S_1' \\
& \vdots \\
\alpha^{(n-k-1)(n-i-1)} \cdot P_{i+1} + \alpha^{(n-k-1)(n-i-2)} \cdot P_{i+2} + \ldots + & \\
\alpha^{(n-k-1)(n-j+1)} \cdot P_{j-1} &= S_{n-k-1}'
\end{aligned}
\quad (24)
$$

The equations (24) are $(n-k)$-element simultaneous equations for the parities $P_{i+1}$ through $P_{j-1}$. Hence, the parities $P_{i+1}$ through $P_{j-1}$ can be obtained by solving the simultaneous equations.

Figure 4:
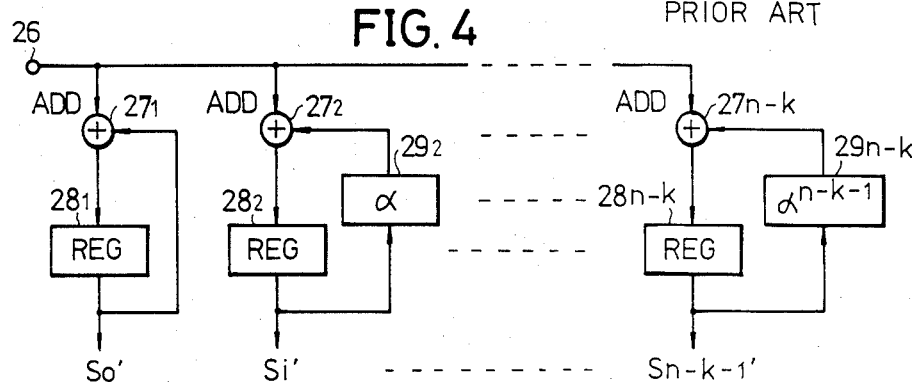

The fourth parity generating circuit shown in FIG. 4 generates the parities by solving the simultaneous equations described heretofore. The code word $W_0'$ described by the equation (21) having zero vectors for the parities $P_{i+1}$ through $P_{j-1}$ is applied serially to an input terminal 26 and is applied to $(n-k)$ adders $27_1$ through $27_{n-k}$. Output signals of the adders $27_1$ through $27_{n-k}$ are independently supplied to corresponding registers $28_1$ through $28_{n-k}$. The output signal of the register $28_1$ is supplied directly to the adder $27_1$ (or via a coefficient multiplier for multiplying a coefficient "1"), and output signals of the registers $28_2$ through $28_{n-k}$ are passed through respective coefficient multipliers $29_2$ through $29_{-k}$ for multiplying coefficients $\alpha$ through $\alpha^{n-k-1}$ and are supplied to the adders $27_2$ through $27_{n-k}$ and added with the input data.

Such an operation is repeated, and the syndromes $S_0'$, $S_1'$, ..., $S_{n-k-1}'$ described by the set of equations (23) are simultaneously obtained in parallel from the registers $28_1$, $28_2$, ..., $28_{n-k}$. Thereafter, when these syndromes $S_0'$, $S_1'$, ..., $S_{n-k-1}'$ are substituted into the simultaneous equations (24) and solved by use of an arithmetic logic unit (ALU, not shown) or the like, it is possible to generate the parities $P_{i+1}$ through $P_{j-1}$.

However, when generating the parities of the code word $W_0$ such as that described by the equation (12) in the third parity generating circuit shown in FIG. 3, there are problems in that the ROM 22 must be used to store each element of the parity generating polynomial $H_1$ because the parity generating matrix $H_1$ has no regularity, and each of the coefficient multipliers $21_1$ through $21_{n-1}$ must be constructed so that it is possible to multiply any kind of coefficient since the coefficients from the ROM 22 successively change depending on the input data. As a result, the scale of the third parity generating circuit as a whole becomes large and the circuit is expensive.

On the other hand, each of the coefficient multipliers $29_2$ through $29_{N-k}$ of the fourth parity generating circuit shown in FIG. 4 always multiplies a constant coefficient to an input signal, and the construction of the coefficient multipliers $29_2$ through $29_{N-k}$ can be simplified compared to that of the third parity generating circuit shown in FIG. 3. However, there is a problem in that when the syndromes $S_0'$ through $S_{n-k-1}$ obtained by the circuit shown in FIG. 4 are substituted into the simultaneous equations (24) so as to generate the parities $P_{i+1}$ through $P_{j-1}$, it is necessary to carry out an extremely large number of operation steps by use of the ALU, for example.

The parity generating circuit according to the present invention eliminates the problems of the first through fourth circuits described heretofore by successively carrying out a division based on a parity generating polynomial and a division based on a reciprocal polynomial.

Figure 5:
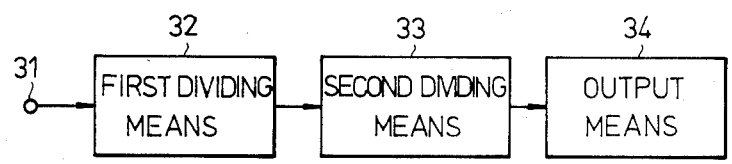
FIG. 5 is a block diagram for explaining the operating principle of the parity generating circuit according to the present invention.

FIG. 5 is a block diagram for explaining the operating principle of the parity generating circuit according to the present invention. In FIG. 5, each element of the row matrix $W_0'$ described by the equation (21) in which the (n−k) parities $P_{i+1}$ through $P_{j−1}$ of the row matrix $W_0$ described by the equation (12) are zero vectors is applied to an input terminal 31 and is supplied to a first dividing means 32 wherein a division is carried out. A second dividing means 33 uses divided results (remainders) from the first dividing means 32 as initial values and carries out a division with the input elements made "0". An output means 34 outputs (n−k) divided results (remainders) from the second dividing means 33 as the parities $P_{i+1}$ through $P_{j−1}$.

According to a first embodiment of the present invention, the first dividing means 32 carries out n dividing steps by the parity generating polynomial G(x) described by the equations (6) and (7), and the second dividing means 33 carries out (n−j+1) dividing steps by a reciprocal polynomial $G^*(x)$ of the parity polynomial G(x), where the reciprocal polynomial $G^*(x)$ is described by $$G(x)^* = a_{n-k} \cdot x^{n-k} + a_{n-k-1} \cdot x^{n-k-1} + \ldots + a_1 \cdot x + 1.$$

According to a second embodiment of the present invention, the first dividing means 32 carries out n dividing steps by the above reciprocal polynomial $G^*(x)$, and the second dividing means 33 carries out i dividing steps by the parity generating polynomial G(x).

First, description will be given with respect to the operating principle of the first embodiment. The row matrix (code word $W_0'$ described by the equation (21) is used to define a polynomial $F_D(x)'$ described by the following equation (25).

$$F_D(x)' = D_1 \cdot x^{n-1} + D_2 \cdot x^{n-2} + \ldots + D_i \cdot x^{n-i} + D_j \cdot x^{n-j} + \ldots + D_n \quad (25)$$

Similarly, the (n−k) parities $P_{i+1}$ through $P_{j−1}$ which are to be generated are used to define the following equation (26), where $n-k = j-i-1$, $2^m - 1 \geq n$ and $n > j > i$.

$$F_P(x) = P_{i+1} \cdot x^{n-i-1} + P_{i+2} \cdot x^{n-i-2} + \ldots + P_{j-1} \cdot x^{n-j+1} \quad (26)$$

When a polynomial corresponding to the original code word $W_0$ described by the equation (12) is denoted by $F_0(x)$, this polynomial $F_0(x)$ can be described by the following equation (27).

$$F_0(x) = F_D(x)' + F_P(x) \quad (27)$$

First, a remainder polynomial $R(x)'$ obtained by dividing the polynomial $F_D(x)'$ by the parity generating polynomial G(x) can be described by the following equation (28).

$$R(x)' = R_1' \cdot x^{n-k-1} + R_2' \cdot x^{n-k-2} + \ldots + R_{n-k-1}' \cdot x + R_{n-k}' \quad (28)$$

Similarly, a remainder polynomial $R(x)''$ obtained by dividing the polynomial $F_P(x)$ by the parity generating polynomial G(x) can be described by the following equation (29).

$$R(x)'' = R_1'' \cdot x^{n-k-1} + R_2'' \cdot x^{n-k-2} + \ldots + R_{n-k-1}'' \cdot x + R_{n-k}'' \quad (29)$$

The following equation (30) stands because the parities are generated so that the polynomial $F_0(x)$ is divisible by the parity generating polynomial G(x).

$$F_0(x) \div G(x) = h_1(x) \text{ remainder } 0 \quad (30)$$

The following equation (31) is obtained when the equation (27) is substituted into the equation (30), and the following equations (32) and (33) also stand.

$$[F_D(x)' + F_P(x)] \div G(x) = h_2(x) \text{ remainder } 0 \quad (31)$$

$$[F_D(x)' + R(x)'] \div G(x) = h_3(x) \text{ remainder } 0 \quad (32)$$

$$[F_P(x) + R(x)''] \div G(x) = h_4(x) \text{ remainder } 0 \quad (33)$$

It can thus be seen by comparing the equations (28) and (29) that the following set of equations (34) stand.

$$\left.\begin{array}{rcl} R_1' &=& R_1'' \\ R_2' &=& R_2'' \\ \cdot & & \cdot \\ \cdot & & \cdot \\ \cdot & & \cdot \\ R_{n-k}' &=& R_{n-k}'' \end{array}\right\} \quad (34)$$

From the following equation (35), it can be seen that the reciprocal polynomial $G^*(x)$ of the parity generating polynomial G(x) can be described by the following equation (36).

$$G(x^{-1}) = x^{-n+k} + a_1 \cdot x^{-n+k+1} + \ldots + a_{n-k-1} \cdot x^{-1} + a_{n-k} \quad (35)$$

$$G^*(x) = a_{n-k} \cdot x^{n-k} + a_{n-k-1} \cdot x^{n-k-1} + \ldots + a_1 \cdot x + 1 \quad (36)$$

The following set of equations (37) is obtained from the circuit shown in FIG. 1 after one dividing step is carried out by the parity generating polynomial G(x) when the input is "0", where $y_1$ through $y_{n-k}$ denote the register values of the (n−k) registers before the dividing step is carried out and $y_1'$ through $y_{n-k}'$ denote the register values of the (n−k) registers after the dividing step is carried out.

$$\left.\begin{array}{rcl} y_1' &=& a_1 \cdot y_1 + y_2 \\ y_2' &=& a_2 \cdot y_1 + y_3 \\ \cdot & & \\ \cdot & & \\ \cdot & & \\ y_{n-k-1}' &=& a_{n-k-1} \cdot y_1 + y_{n-k} \end{array}\right\} \quad (37)$$

The equation (37) can be described in a matrix form as shown in the following equation (38).

$$\begin{pmatrix} y_1' \\ y_2' \\ \cdot \\ \cdot \\ \cdot \\ y_{n-k}' \end{pmatrix} = \begin{pmatrix} a_1, & 1, & 0, & \ldots, & 0 \\ a_2, & 0, & 1, & \ldots, & 0 \\ \cdot & \cdot & \cdot & & \cdot \\ \cdot & \cdot & \cdot & & \cdot \\ \cdot & \cdot & \cdot & & , 1 \\ a_{n-k}, & 0, & & \ldots, & 0 \end{pmatrix} \qquad (38)$$

The equation (38) can be rewritten as the following equation (39).

$$y' = T \cdot y \qquad (39)$$

Similarly, when the first dividing step carried out by the reciprocal polynomial $G^*(x)$ when the input is "0" can be described in a matrix form as shown in the following equation (40), where $z_1$ through $z_{n-k}$ denote the register values before the dividing step is carried out and $z_1'$ through $z_{n-k}'$ denote the register values after the dividing step is carried out.

$$\begin{pmatrix} z_1' \\ z_2' \\ \cdot \\ \cdot \\ \cdot \\ z_{n-k}' \end{pmatrix} = \begin{pmatrix} 0, & 0, & \ldots, & 0, & 1/a_{n-k} \\ 1, & 0, & \ldots, & 0, & a_1/a_{n-k} \\ 0, & 1, & \ldots & & \\ \cdot & \cdot & \cdot & & \cdot \\ \cdot & \cdot & & & \cdot \\ 0, & 0, & \ldots, & 1, & a_{n-k-1}/a_{n-k} \end{pmatrix} \begin{pmatrix} z_1 \\ z_2 \\ \cdot \\ \cdot \\ \cdot \\ z_{n-k} \end{pmatrix} \qquad (40)$$

The following equation (41) is obtained when the left term of the equation (40) is denoted by a column vector $z'$ and the right terms of the equation (40) are denoted by a matrix $T^*$ and a column vector $z$.

$$z' = T^* \cdot z \qquad (41)$$

The following equation (42) calculates $T \cdot T^*$, where I denotes a unit matrix.

$$T \cdot T^* = \begin{pmatrix} a_1, & 1, & 0, & \ldots, & 0 \\ a_2, & 0, & 1, & \ldots, & \cdot \\ \cdot & \cdot & \cdot & & \cdot \\ \cdot & \cdot & \cdot & & \cdot \\ \cdot & \cdot & \cdot & & , 1 \\ a_{n-k}, & 0, & 0, & \ldots, & 0 \end{pmatrix} \cdot \begin{pmatrix} 0, & 0, & \ldots, & 0, & 1/a_{n-k} \\ 1, & 0, & \ldots, & 0, & a_1/a_{n-k} \\ \cdot & \cdot & & \cdot & \cdot \\ \cdot & \cdot & & \cdot & \cdot \\ 0, & 0, & \ldots, & 1, & a_{n-k-1}/a_{n-k} \end{pmatrix} \qquad (42)$$

$$= \begin{pmatrix} 1, & 0, & \ldots, & 0 \\ 0, & 1, & \ldots, & 0 \\ \cdot & \cdot & & \cdot \\ \cdot & \cdot & & \cdot \\ 0, & 0, & \ldots, & 1 \end{pmatrix} = I$$

Accordingly, the following equations can be obtained $$\begin{cases} y' = T \cdot y \\ y = T^* \cdot y' \end{cases} \qquad \begin{cases} z' = T^* \cdot z \\ z = T \cdot z' \end{cases}$$

The relationship between the polynomials $F_P(x)$ and $R(x)'$ (=$R(x)''$) can be described by the following equation (43) by use of the matrix T $$\begin{pmatrix} R_1' \\ R_2' \\ \cdot \\ \cdot \\ \cdot \\ R_{n-k}' \end{pmatrix} = T^{n-j+1} \cdot \begin{pmatrix} P_{i+1} \\ P_{i+2} \\ \cdot \\ \cdot \\ \cdot \\ P_{j-1} \end{pmatrix} \qquad (43)$$

Hence, the parities $P_{i+1}$ through $P_{j-1}$ can be described by the following equation (44) by use of the equation (43).

$$\begin{pmatrix} P_{i+1} \\ P_{i+2} \\ \cdot \\ \cdot \\ \cdot \\ P_{j-1} \end{pmatrix} = (T^*)^{n-j+1} \cdot \begin{pmatrix} R_1' \\ R_2' \\ \cdot \\ \cdot \\ \cdot \\ R_{n-k}' \end{pmatrix} \qquad (44)$$

Therefore, in the first embodiment of the invention, the equation (28) can be realized in the first dividing means 32 by n dividing steps carried out by the parity generating polynomial G(x), and the equation (44) can be realized thereafter in the second dividing means 33 by (n−j+1) dividing steps carried out by the reciprocal polynomial $G^*(x)$ having as the initial values the divided results (remainders) $R_1'$ through $R_{n-k}'$ obtained in the first dividing means 32. As may be seen from the equation (44), the (n−k) parities $P_{i+1}$ through $P_{j-1}$ can be generated by realizing the equation (44).

Next, description will be given with respect to the operating principle of the second embodiment. First, the code word $W = [C_1, C_2, \ldots, C_n]$ of the (n, k) Reed Solomon code is used to define a polynomial $F_C(x)$ described by the following equation (45), where it is assumed that (n−k) parities exist in the elements $C_1$ through $C_n$ of the code word W.

$$F_C(x) = C_1 \cdot x^{n-1} + C_2 \cdot x^{n-2} + \ldots + C_{n-1} \cdot x + C_n \qquad (45)$$

The following set of equations (46) stand because this code word W satisfies the check operation $H_0 \cdot W^T = [0, \ldots, 0]^T$ described by the equation (4).

$$\left. \begin{array}{l} F_C(1) = 0 \\ F_C(\alpha) = 0 \\ \cdot \\ \cdot \\ \cdot \\ F_C(\alpha^{n-k-1}) = 0 \end{array} \right\} \qquad (46)$$

Next, a code word $W^* = [C_n, C_{n-1}, \ldots, C_1]$ having the contents of the code word W re-arranged in the reverse sequence is considered, and this code word $W^*$ is used to define a polynomial $F_C^*(x)$ described by the following equation (47).

$$F_C^*(x) = C_n \cdot x^{n-1} + C_{n-1} \cdot x^{n-2} + \ldots + C_2 \cdot x + C_1 \qquad (47)$$

The following equation (48) can be obtained by transforming the equation (47).

$$\begin{aligned} F_C^*(x) &= x^{n-1} \cdot [C_n + C_{n-1} \cdot x^{-1} + \ldots + C_2 \cdot x^{-(n-2)} + C_1 \cdot x^{-(n-1)}] \\ &= x^{n-1} \cdot F_C(x^{-1}) \end{aligned} \qquad (48)$$

The following set of equations (49) can thus be obtained from the equation (46).

$$\left. \begin{array}{l} F_C^*(1) = 1^{n-1} \cdot F_C(1) = 1^{n-1} \cdot 0 = 0 \\ F_C^*(1/\alpha) = (1/\alpha)^{n-1} \cdot F_C(\alpha) = (1/\alpha)^{n-1} \cdot 0 = 0 \\ \cdot \\ \cdot \\ F_C^*(1/\alpha^{n-k-1}) = (1/\alpha^{n-k-1})^{n-1} \cdot F_C(\alpha^{n-k-1}) \\ \qquad = (1/\alpha^{n-k-1})^{n-1} \cdot 0 = 0 \end{array} \right\} \qquad (49)$$

Accordingly, it may be regarded that the generating polynomial G(x)' with respect to the code word $W^*$ can be described by the following equation (50).

$$G(x)' = (x-1) \cdot (x-1/\alpha) \cdot \ldots \cdot (x-1/\alpha^{n-k-1}) \qquad (50)$$

While the parity generating polynomial G(x) has roots of $1, \alpha, \ldots, \alpha^{n-k-1}$, the generating polynomial G(x)' described by the equation (50) has roots of $1, 1/\alpha, \ldots, 1/\alpha^{n-k-1}$, that is, roots which are inverse numbers of the roots of the parity generating polynomial G(x). For this reason, the generating polynomial G(x)' is the reciprocal polynomial $G^*(x)$ of the parity generating polynomial G(x). Similarly, a generating polynomial with respect to the code word $W^*$ can be treated as being $G^*(x)$ as in the case for the code word W, and a reciprocal polynomial of the generating polynomial $G^*(x)$ can be treated as being G(x).

A code word $W_0^*$ described by the following equation (51) is considered, and the code word $W_0^*$ in which the (n−k) parities $P_{j-1}, \ldots, P_{i+1}$ are zero vectors is used to define the following equation (52).

$$W_0^* = [D_n, \ldots, D_j, P_{j-1}, \ldots, P_{i+1}, D_i, \ldots, D_1] \qquad (51)$$

$$\begin{aligned} F_D^*(x) &= D_n \cdot x^{n-1} + D_{n-1} \cdot x^{n-2} + \ldots \\ &\quad + D_j \cdot x^{j-1} + D_i \cdot x^{i-1} + \ldots + D_2 \cdot x + D_1 \end{aligned} \qquad (52)$$

The parities $P_{j-1}, \ldots, P_{i+1}$ can be used to similarly define the following equation (53).

$$F_P^*(x) = P_{j-1} \cdot x^{j-2} + P_{j-2} \cdot x^{j-3} + \ldots + P_{i+1} \cdot x^i \qquad (53)$$

A remainder polynomial obtained by dividing $F_D^*(x)$ by the generating polynomial $G^*(x)$ with respect to the code word $W_0^*$ and a remainder polynomial obtained by dividing $F_P^*(x)$ by the generating polynomial $G^*(x)$ with respect to the code word $W_0^*$ are equal to each other, and these remainder polynomials will be denoted by $R^*(x)$ described by the following equation (54).

$$\begin{aligned} R^*(x) &= R_{n-k}^* \cdot x^{n-k-1} + R_{n-k-1}^* \cdot x^{n-k-2} + \ldots \\ &\quad + R_2^* \cdot x + R_1^* \end{aligned} \qquad (54)$$

The relationship between $F_P^*(x)$ and $R^*(x)$ can be described by the following equation (55) by use of the matrix $T^*$.

$$\begin{pmatrix} R_1^* \\ R_2^* \\ \cdot \\ \cdot \\ \cdot \\ R_{n-k}^* \end{pmatrix} = (T^*)^i \cdot \begin{pmatrix} P_{i+1} \\ P_{i+2} \\ \cdot \\ \cdot \\ \cdot \\ P_{j-1} \end{pmatrix} \qquad (55)$$

Accordingly, the parities $P_{i+1}$ through $P_{j-1}$ can be described by the following equation (56) by use of the equation (55).

$$\begin{pmatrix} P_{i+1} \\ P_{i+2} \\ \cdot \\ \cdot \\ \cdot \\ P_{j-1} \end{pmatrix} = T^i \cdot \begin{pmatrix} R_1^* \\ R_2^* \\ \cdot \\ \cdot \\ \cdot \\ R_{n-k}^* \end{pmatrix} \qquad (56)$$

Therefore, in the second embodiment of the invention, the divided results (remainders) of the equation (54) can be obtained in the first dividing means 32 by n dividing steps carried out by the reciprocal polynomial $G^*(x)$ of the parity generating polynomial G(x) (that is, by the generating polynomial $G^*(x)$ with respect to the code word $W_0^*$) on the code word in which the (n−k)

parities $P_{i+1}$ through $P_{j-1}$ of the code word $W_0^*$ in the equation (51) are zero vectors, and the (n−k) parities $P_{i+1}$ through $P_{j-1}$ can be obtained thereafter in the second dividing means 33 which has "0" input by i dividing steps of the equation (56) carried out by the parity generating polynomial G(x) (that is, by the reciprocal polynomial G(x) with respect to the code word $W_0^*$) having as the initial values the divided results (remainders) obtained in the first dividing means 32.

In the present specification, "one dividing step" means the incrementing of the degree by one in the polynomial which is to be subjected to the division, that is, changing of the maximum degree from N to N−1 in the polynomial which is to be subjected to the division.

Figure 7:
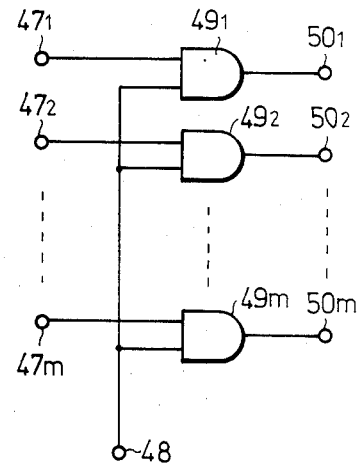
FIG. 7 is a circuit diagram showing an embodiment of a gate circuit in the block system shown in FIG. 6.
Figure 6:
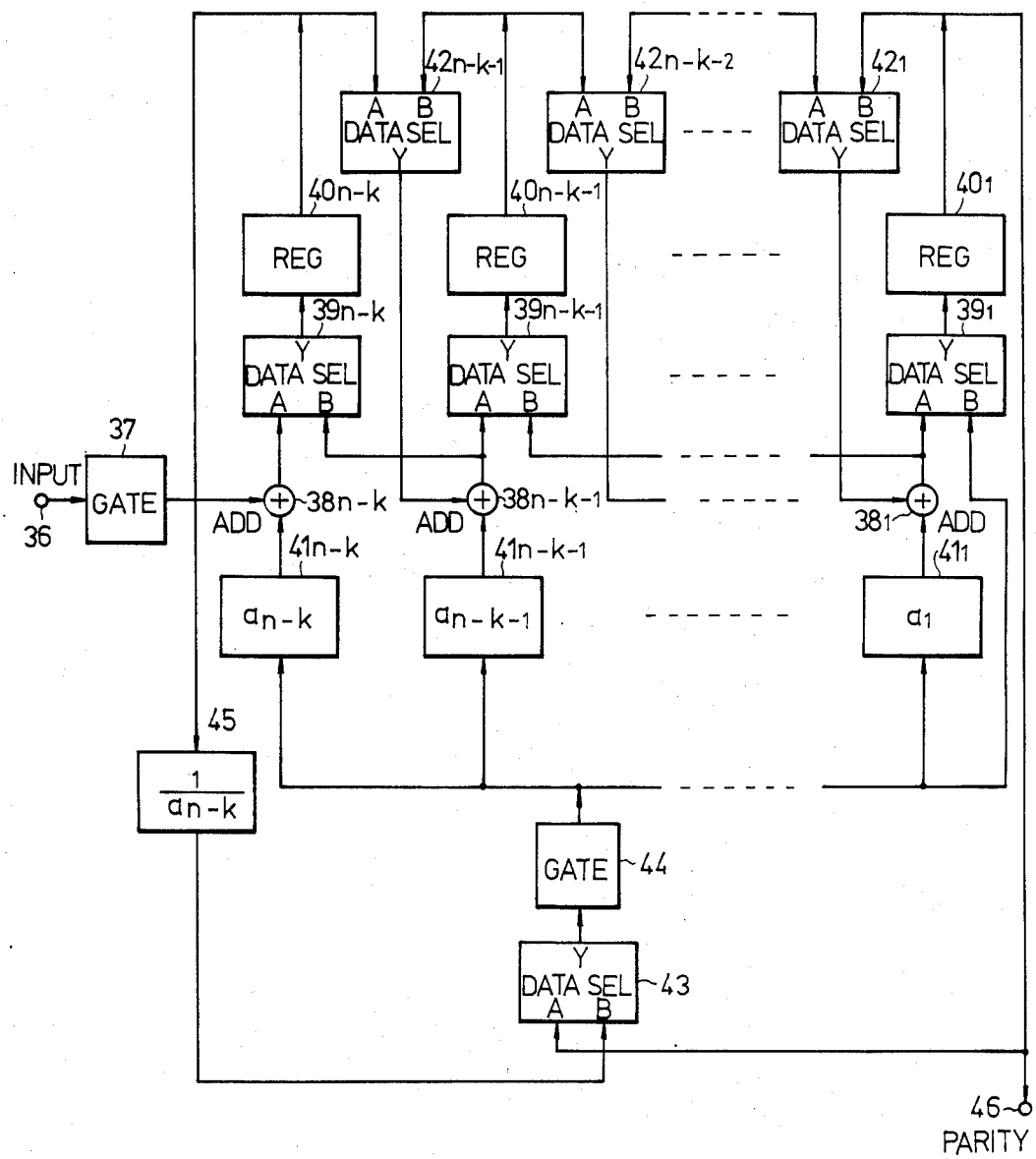
FIG. 6 is a system block diagram showing a first embodiment of the parity generating circuit according to the present invention.

Next, description will be given with respect to the block systems of the embodiments of the invention. FIG. 6 shows the block system of the first embodiment. In FIG. 6, an input signal applied to an input terminal 36 is passed through a gate circuit 37 and a total of k m-bit data $D_1$ through $D_i$ and $D_j$ through $D_n$ and a total of (n−k) m-bit zero vectors which are elements of the row matrix $W_0$ described by the equation (21) are supplied serially to an adder $38_{n-k}$ in the sequence of $D_1, D_2, \ldots, D_i, 0, \ldots, 0, D_j, \ldots, D_n$. The gate circuit 37 and a gate circuit 44 which will be described later respectively comprise m AND circuits $49_1$ through $49_m$ coupled in parallel as shown in FIG. 7. Each bit of the m-bit input signal from the input terminal 36 are supplied to the corresponding AND circuits $49_1$ through $49_m$ via respective input terminals $47_1$ through $47_m$. A control signal is supplied to each of the AND circuits $49_1$ through $49_m$ via an input terminal 48, so as to supply to output terminals $50_1$ through $50_m$ the input signal from the input terminals $47_1$ through $47_m$ as it is or to supply a signal having all of the bits thereof made zero responsive to the control signal. When inputting the data, the zero vectors can be inputted by use of this gate circuit 37.

The adder $38_{n-k}$ and remaining (n−k−1) adders $38_1$ through $38_{n-k-1}$ supply output signals thereof to first input terminals A of corresponding ones of (n−k) data selectors $39_1$ through $39_{n-k}$. In addition, signals from output terminals Y of the data selectors $39_1$ through $39_{n-k}$ are independently supplied to corresponding ones of (n−k) m-bit registers $40_1$ through $40_{n-k}$.

The output signals of the adders $38_1$ through $38_{n-k-1}$ are supplied to second input terminals B of the data selectors $39_2$ through $39_{n-k}$, respectively. An output signal of the gate circuit 44 is supplied to a second input terminal B of the data selector $39_1$. Output signals of the registers $40_1$ through $40_{n-k-1}$ are supplied to second input terminals B of data selectors $42_1$ through $42_{n-k-1}$, respectively, and the output signals of the registers $40_2$ through $40_{n-k}$ are supplied to first input terminals A of the data selectors $42_1$ through $42_{n-k-1}$, respectively. In addition, the output signal of the register $40_1$ is supplied to a first input terminal A of a data selector 43, and an output signal of the register $40_{n-k}$ are supplied to a second input terminal B of the data selector 43 via a coefficient multiplier 45 for multiplying a coefficient $1/a_{n-k}$. An output signal from an output terminal Y of the data selector 43 is passed through the gate circuit 44 and is simultaneously supplied to coefficient multipliers $41_1, \ldots, 41_{n-k-1}, 41_{n-k}$ for multiplying coefficients $a_1, \ldots, a_{n-k-1}, a_{n-k}$, respectively. Output signals of the multipliers $41_1, \ldots, 41_{n-k-1}, 41_{n-k}$ are supplied to the adders $38_1, \ldots, 38_{n-k-1}, 38_{n-k}$, respectively.

Before the first data $D_1$ is supplied to the adder $38_{n-k}$, the registers $40_1$ through $40_{n-k}$ are cleared. In addition, the data selectors $39_1$ through $39_{n-k}$, $42_1$ through $42_{n-k-1}$ and 43 are all controlled to selectively output the signals applied to the first input terminals A thereof from the output terminals Y thereof, and the gate circuit 44 is controlled to pass the data. Accordingly, the parity generating circuit shown in FIG. 6 has a circuit construction similar to that of the circuit shown in FIG. 1, and constitutes the first dividing means 32. A circuit which is obtained when the registers $13_1$ through $13_{n-k}$ in FIG. 1 are replaced by the registers $40_1$ through $40_{n-k}$, the adders $12_1$ through $12_{n-k}$ are replaced by the adders $38_1$ through $38_{n-k}$ and the multipliers $14_1$ through $14_{n-k}$ are replaced by the multipliers $41_1$ through $41_{n-k}$, corresponds to the circuit shown in FIG. 6 for the case where the data selectors $39_1$ through $39_{n-k}$, $42_1$ through $42_{n-k-1}$ and 43 selectively output the signals applied to the first input terminals A thereof.

The change in the register values when the data supplied to the adder $38_{n-k}$ via the gate circuit 37 changes from a certain data to a next data can be described by the following set of equations (57), where $r_1, \ldots, r_{n-k-1}, r_{n-k}$ denote register values of the registers $40_1, \ldots, 40_{n-k-1}, 40_{n-k}$, $C_x$ denotes the input data and $a_1, \ldots, a_{n-k-1}, a_{n-k}$ denote multiplying coefficients (constants) of the multipliers $41_1, \ldots, 41_{n-k-1}, 41_{n-k}$.

$$\left. \begin{aligned} r_1 &= a_1 \cdot r_1 + r_2 \\ r_2 &= a_2 \cdot r_1 + r_3 \\ &\vdots \\ r_{n-k-1} &= a_{n-k-1} \cdot r_1 + r_{n-k} \\ r_{n-k} &= a_{n-k} \cdot r_1 + C_x \end{aligned} \right\} \quad (57)$$

Accordingly, one dividing step is carried out every time one of the n elements of the row matrix $W_0$ described by the equation (21) is supplied to the adder $38_{n-k}$ and is entered into the register $40_{n-k}$, and n dividing steps are carried out when all of the n elements are entered similarly. As a result, as described before, the divided results (remainders) $R_1', \ldots, R_{n-k-1}', R_{n-k}'$ obtained by the division of the parity generating polynomial G(x) remain in the respective registers $40_1, \ldots, 40_{n-k-1}, 40_{n-k}$.

Next, zero vectors are inputted by the gate circuit 37, the gate circuit 37 is controlled to pass the input thereof, and all of the data selectors $39_1$ through $39_{n-k}$, $42_1$ through $42_{n-k-1}$ and 43 are switched and controlled so as to selectively output from the output terminals Y thereof the input signals applied to the second input terminals B thereof. Hence, the circuit shown in FIG. 6 becomes a dividing circuit of the reciprocal polynomial G*(x) in which the divided results (remainders) $R_1'$ through $R_{n-k}'$ remaining in the registers $40_1$ through $40_{n-k}$ are used as initial values and the input elements are made "0" by disconnecting the input terminal 36 from the circuit, and the circuit shown in FIG. 6 becomes equivalent to a circuit shown in FIG. 8.

Figure 8:
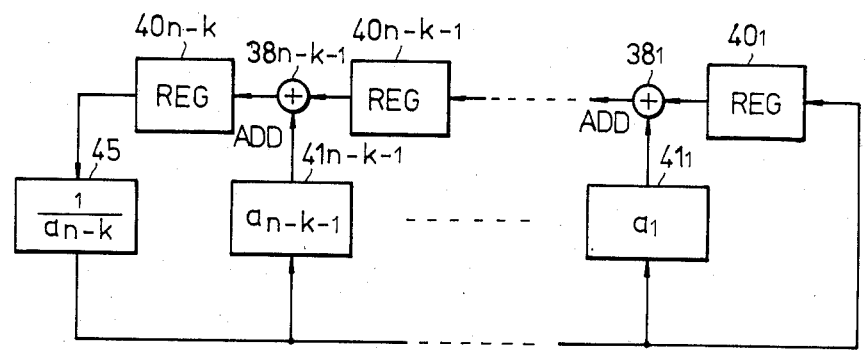
FIGS. 8 and 9 respectively show equivalent circuits of the block system shown in FIG. 6 at different stages.

In FIG. 8, those parts which are the same as those corresponding parts in FIG. 6 are designated by the same reference numerals. Every time the clock pulse is inputted once the register values (stored values) in the registers $40_1$ through $40_{n-k}$ of this second dividing circuit shown in FIG. 8 change as described by the following set of equations (58), where $1/a_{n-k}$ denotes the multiplying coefficient of the multiplier 45, $a_1, \ldots, a_{n-k-1}$ respectively denote the multiplying coefficients of the multipliers $41_1, \ldots, 41_{n-k-1}$ and $r_1, \ldots, r_{n-k-1}, r_{n-k}$ respectively denote the register values of the registers $40_1, \ldots, 40_{n-k-1}, 40_{n-k}$.

$$\left.\begin{aligned} r_1 &= (1/a_{n-k}) \cdot r_{n-k} \\ r_2 &= (a_1/a_{n-k}) \cdot r_{n-k} + r_1 \\ &\vdots \\ r_{n-k-1} &= (a_{n-k-2}/a_{n-k}) \cdot r_{n-k} + r_{n-k-2} \\ r_{n-k} &= (a_{n-k-1}/a_{n-k}) \cdot r_{n-k} + r_{n-k-1} \end{aligned}\right\} \quad (58)$$

Accordingly, when the clock pulse is inputted $(n-j+1)$ times in total and $(n-j+1)$ dividing steps are carried out, it is possible to realize the second dividing means 33 described before. As a result, as described by the equation (44), the parities $P_{i+1}, \ldots, P_{j-2}, P_{j-1}$ respectively remain as register values of the registers $40_1, \ldots, 40_{n-k-1}, 40_{n-k}$.

Next, all of the data selectors $39_1$ through $39_{n-k}$, $42_1$ through $42_{n-k-1}$ and 33 are switched and controlled so as to selectively output the input signals applied to the first input terminals A thereof. Further, the gate circuits 37 and 44 are controlled so as to constantly output zero vectors. Hence, the circuit shown in FIG. 6 becomes equivalent to a circuit shown in FIG. 9, and it is possible to realize the output means 34 described before.

Figure 9:
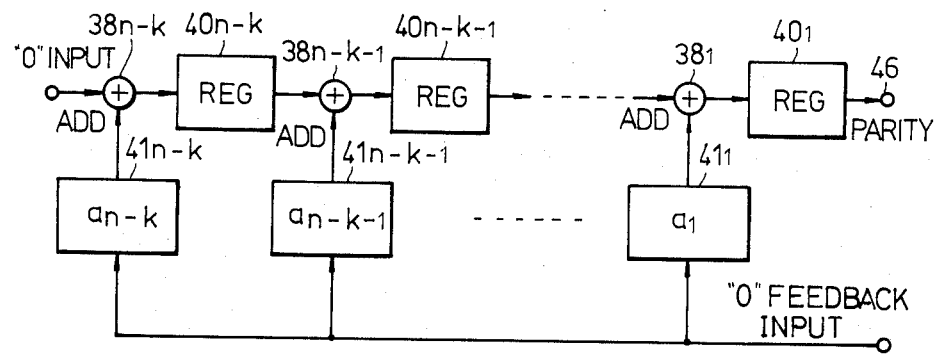

In FIG. 9, those parts which are the same as those corresponding parts in FIG. 6 are designated by the same reference numerals. The output signals of the multipliers $41_1$ through $41_{n-k}$ become zero vectors due to the output zero vectors of the gate circuit 44, and it is thus possible to successively supply the stored parities $P_{i+1}, \ldots, P_{j-2}, P_{j-1}$ in the registers $40_1, \ldots, 40_{n-k-1}, 40_{n-k}$ serially to the output terminal 46.

According to the present embodiment, all of the multipliers $41_1$ through $41_{n-k}$ and 45 multiply a constant multiplying coefficient and accordingly have a simple circuit construction, and it is unnecessary to use an arithmetic logic unit (ALU) or the like. In addition, it is possible to make the circuit extremely simple and inexpensive by using in common the registers $40_1$ through $40_{n-k}$ for the divisions in two stages.

Figure 10:
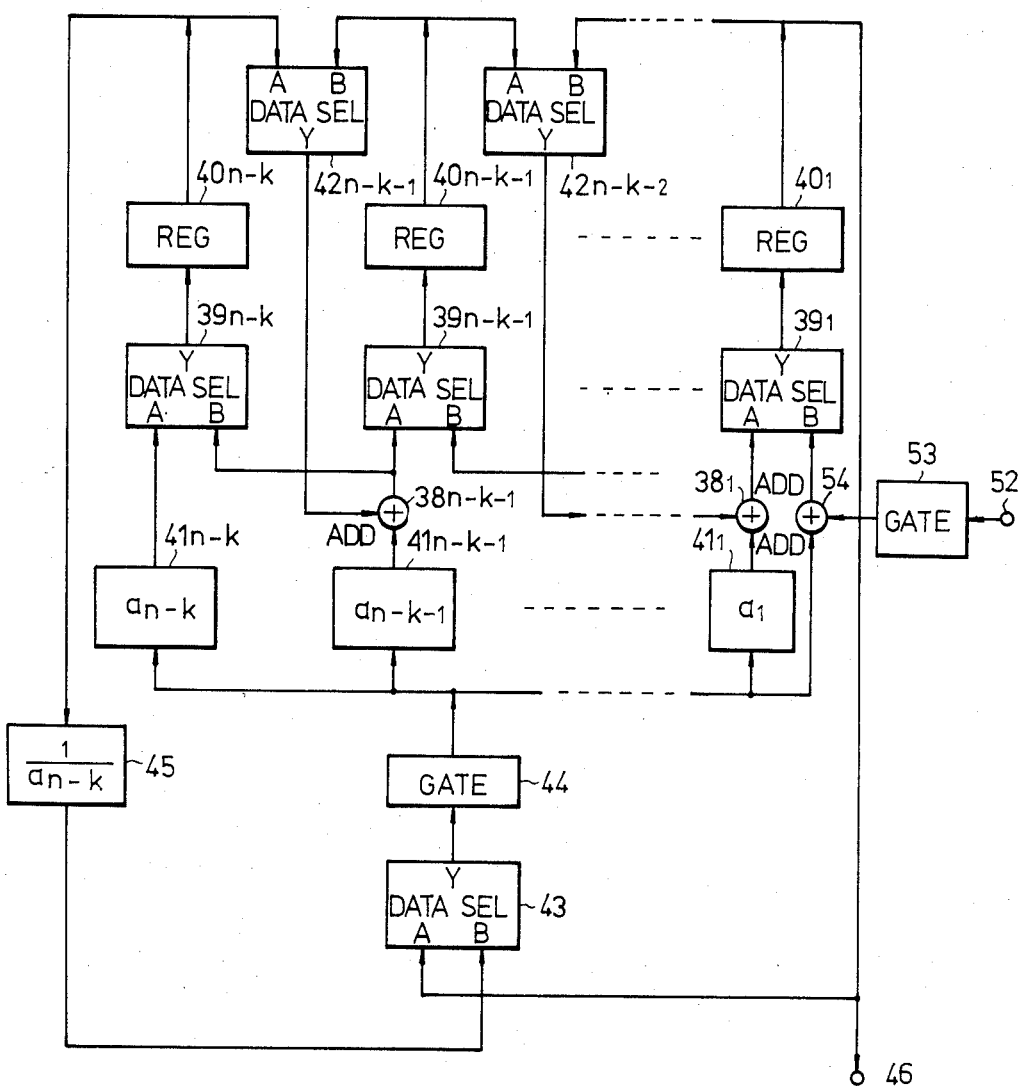
FIG. 10 is a system block diagram showing a second embodiment of the parity generating circuit according to the present invention.

Next, description will be given with respect to the second embodiment of the parity generating circuit according to the present invention. FIG. 10 shows the second embodiment of the parity generating circuit, and in FIG. 10, those parts which are the same as those corresponding parts in FIG. 6 are designated by the same reference numerals, and description thereof will be omitted. According to the present embodiment, an input terminal 52, a gate circuit 53 and an adder 54 are added and the input terminal 36, the gate circuit 37 and the adder $38_{n-k}$ are deleted when compared to the first embodiment described before. The k data $D_n$ through $D_j$ and $D_i$ through $D_1$ applied to the input terminal 52 are passed through the gate circuit 53 and the parities $P_{i+1}$ through $P_{j-1}$ within the code word $W_0^*$ described by the equation (51) are made zero vectors by the gate circuit 53. Hence, a total of n elements are supplied to the adder 54 in the sequence of the data $D_n, D_{n-1}, \ldots, D_2, D_1$.

After the registers $40_1$ through $40_{n-k}$ are cleared, all of the data selectors $39_1$ through $39_{n-k}$, $42_1$ through $42_{n-k-1}$ and 43 are switched and controlled so as to selectively output the input signals applied to the second input terminals B thereof, and the gate circuit 44 passes the output signal of the data selector 43. Accordingly, the circuit shown in FIG. 10 becomes equivalent to the circuit shown in FIG. 8 but with the adder 54 additionally provided on the input side of the register $40_1$ for adding the output signal of the multiplier 45 and the signal from the gate circuit 53. Such a dividing circuit carries out n dividing steps by the reciprocal polynomial $G^*(x)$ with respect to the input vectors, and the divided results (remainders) $R_1^*, \ldots, R_{n-k-1}^*, R_{n-k}^*$ of the equation (54) obtained by the first dividing means 32 respectively remain in the registers $40_1, \ldots, 40_{n-k-1}, 40_{n-k}$.

Next, all of the data selectors $39_1$ through $39_{n-k}$, $42_1$ through $42_{n-k-1}$ and 43 are switched and controlled so as to selectively output the input signals applied to the first input terminals A thereof, and the gate circuit 44 passes the output signal of the data selector 43. Thus, the circuit shown in FIG. 10 becomes equivalent to the circuit shown in FIG. 1 but with no adder corresponding to the adder $12_{n-k}$ so that the signal from the multiplier $41_{n-k}$ (the multiplier $14_{n-k}$ in FIG. 1) for multiplying the coefficient $a_{n-k}$ is supplied directly to the register $40_{n-k}$.

Therefore, the input data from the input terminal 52 is not supplied, and the circuit having the above described construction carries out i dividing steps with the divided results of the first dividing means 32 used as initial values and the input elements made "0". When the i dividing steps of the parity generating polynomial $G(x)$ described by the equation (56) is finished, the parities $P_{i+1}, \ldots, P_{j-1}$ respectively remain in the registers $40_1, \ldots, 40_{n-k}$.

Next, all of the data selectors $39_1$ through $39_{n-k}$, $42_1$ through $42_{n-k-1}$ and 43 are controlled so as to continue to output the input signals applied to the first input terminals A thereof, and the gate circuits 44 and 53 are controlled to output zero vectors. The register values generated by the second dividing means 33 under these conditions and remaining in the registers $40_1$ through $40_{n-k}$ are successively read out from the registers $40_1, 40_2, \ldots, 40_{n-k-1}, 40_{n-k}$ in this sequence as the parities $P_{i+1}, P_{i+2}, \ldots, P_{j-2}, P_{j-1}$ and are obtained via the output terminal 46.

In each of the embodiments shown in FIGS. 6 and 10, it is possible to switch and control all of the data selectors $39_1$ through $39_{n-k}$, $42_1$ through $42_{n-k-1}$ and 43 so as to selectively output the input signals applied to the second input terminals B thereof when reading out the register values from the registers $40_1$ through $40_{n-k}$. In this case, the parities $P_{j-1}, P_{j-2}, \ldots, P_{i+1}$ are successively read out from the register $40_{n-k}$ in this sequence.

Furthermore, the embodiments shown in FIGS. 6 and 10 may be combined to have two input terminals so as to selectively generate the parities depending on whether the input of the code word is made from the data $D_1$ or the data $D_n$. In this case, measures are taken so that zero vectors are constantly obtained from the input terminal which is not used.

In the embodiments described heretofore, the registers and multipliers are used in common between the first and second dividing means. However, it is of course to constitute the first and second dividing means by independent circuits.

Further, the present invention is not limited to these embodiments, but various variations and modifications may be made without departing from the scope of the present invention.

What is claimed is:

1. A parity signal generating circuit for generating parity signals $P_{i+1}, \ldots, P_{j-1}$ of a Reed Solomon code described by a row matrix $W_0=(D_1, D_2, \ldots, D_i, P_{i+1}, \ldots, P_{j-1}, D_j, \ldots, D_n)$ where $D_1$ through $D_i$ and $D_j$ through $D_n$ denotes k m-bit data and $P_{i+1}$ through $P_{j-1}$ denote (n−k) m-bit parity signals, $n-k=j-i-1$, $2^m-1 \geq n$ and $n>j>i$, where i, j, n, k and m are positive integers, said parity signals of said Reed Solomon code being used for detecting and correcting errors in said data of said Reed Solomon code, said parity signal generating circuit comprising:

gate means supplied with an input signal for successively producing n elements $D_1, D_2, \ldots, D_i, 0, \ldots, 0, D_j, \ldots, D_n$ in this sequence;

a first adder supplied with the element $D_1, D_2, \ldots, D_i, 0, \ldots, 0, D_j, \ldots, D_n$ successively from said gate means;

second through (n−k)th adders;

first through (n−k)th registers supplied with output signals of said first through (n−k)th adders;

switching means assuming one of first and second switching states for switching input and output signals of said first through (n−k)th registers;

first through (n−k−1)th multipliers coupled to input sides of said second through (n−k)th adders, respectively;

a (n−k)th multiplier coupled to an input side of said first adder; and a (n−k+1)th multiplier coupled to an output side of said first register, said switching means in said first switching state supplying the output signal of said (n−K)th register to each of said second through (n−K)th adders via corresponding ones of said first through (n−k−1)th multipliers so that said second through (n−k)th adders respectively add the output signals of said first through (n−k−1)th registers and output signals of said corresponding ones of said first through (n−k−1)th multipliers and supplying the output signal of said (n−k)th register to said first adder via said (n−k)th multiplier so that said first adder adds one of the elements $D_1, D_2, \ldots, D_i, 0, \ldots, 0, D_j, \ldots, D_n$ and an output signal of said (n−k)th multiplier, said first through (n−k)th adders supplying added signals to said first through (n−k)th registers, respectively, said first through (n−k)th adders, said first through (n−k)th registers, said switching means in said first switching state and said first through (n−k+1)th multipliers carrying out a dividing step by a parity generating polynomial G(x) each time one of the elements $D_1, D_2, \ldots, D_i, 0, \ldots, 0, D_j, \ldots, D_n$ is supplied to said first adder, said parity generating polynomial G(x) being described by $$G(x) = (x-1) \cdot (x-\alpha) \cdot \ldots \cdot (x-\alpha^{n-k-1})$$
$$= x^{n-k} + a_1 \cdot x^{n-k-1} + a_2 \cdot x^{n-k-2} + \ldots + a_{n-k-1} \cdot x + a_{n-k},$$

where $\alpha$ is a primitive element of Galois Field $GF(2^m)$ and $a_1$ through $a_{n-k}$ are constants, a divided result of the dividing step by said parity generating polynomial G(x) being obtained as values in said first through (n−k)th registers, said switching means assuming said second switching state after the dividing step by said parity generating polynomial G(x) is carried out n times, said switching means in said second state supplying the output signal of said first register to each of said first through (n−k−1)th multipliers and to said (n−k)th register via said (n−k+1)th multiplier so that said second through (n−k)th adders add the output signals of said first through (n−k−1)th multipliers and said second through (n−k)th register and added signals from said second through (n−k)th adders are respectively supplied to said first through (n−k−1)th registers, said first through (n−k)th adders, said first through (n−k)th registers, said switching means in said second switching state and said first through (n−k+1)th multipliers carrying out a dividing step by a reciprocal polynomial G*(x) of said parity generating polynomial G(x) with respect to the values in said first through (n−K)th registers, where said reciprocal polynomial G*(x) is $$G^*(x) = a_{n-k} \cdot x^{n-k} + a_{n-k-1} \cdot x^{n-k-1} + \ldots + a_1 \cdot x + 1,$$

a divided result of the dividing step by said reciprocal polynomial G*(x) being obtained as new values in said first through (n−K) registers, the parity signals $P_{i+1}, \ldots, P_{j-1}$ being obtained in said first through (n−k)th registers after the dividing step by said reciprocal polynomial G*(x) is carried out (n−j+1) times.

2. A parity signal generating circuit as claimed in claim 1 in which said first through (n−k−1)th multipliers respectively multiply the coefficients $a_1$ through $a_{n-k-1}$, said (n−k)th multiplier multiplies the coefficient $a_{n-k}$ and said (n−k+1)th multiplier multiplies a coefficient $1/a_{n-k}$.

3. A parity signal generating circuit as claimed in claim 2 in which said switching means comprises a first data selector for selectively supplying to said first through (n−k)th multipliers the output signal of said (n−k)th register in said first switching state and the output signal of said (n−k+1)th multiplier in said second switching state, (n−k) second data selectors, an L-th second data selector selectively supplying to an L-th register the output signal of an L-th adder in said first switching state and the output signal of a (L+1)th adder in said second switching state, where L=1, 2, ..., (n−k−1), a (n−k)th second data selector selectively supplying to said (n−k)th register the output signal of said (n−k)th adder in said first switching state and the output signal of said first data selector in said second switching state, and (n−k−1) third data selectors, an M-th third data selector selectively supplying to a (M+1)th adder the output signal of an M-th register in said first switching state and the output signal of a (M+1)th register in said second switching state, where M=1, 2, ..., (n−k−1).

4. A parity signal generating circuit for generating parity signals $P_{i+1}, \ldots, P_{j-1}$ of a Reed Solomon code described by a row matrix $W_0=(D_1, D_2, \ldots, D_i, P_{i+1}, \ldots, P_{j-1}, D_j, \ldots, D_n)$, where $D_1$ through $D_i$ and $D_j$ through $D_n$ denote k m-bit data and $P_{i+1}$ through $P_{j-1}$ denote (n−k) m-bit parity signals, n−k=j−i−1, $2^m-1 \geq n$ and n>j>i, where i, j, n, k and m are positive integers, said parity signals of said Reed Solomon code being used for detecting and correcting errors in said data of said Reed Solomon code, said parity signal generating circuit comprising:

gate means supplied with an input signal for successively producing n elements $D_1, D_2, \ldots, D_i, 0, \ldots, 0, D_j, \ldots, D_n$ in this sequence;

a first adder supplied with the element $D_1, D_2, \ldots, D_i, 0, \ldots, 0, D_j, \ldots, D_n$ successively from said gate means;

second through (n−k)th adders;

first through (n−k)th registers supplied with output signals of said first through (n−k)th adders;

switching means assuming one of first and second switching states for switching input and output signals of said first through (n−k)th registers;

first through (n−k−1)th multipliers coupled to input sides of said second through (n−k)th adders, respectively;

a (n−k)th multiplier coupled to an input side of said (n−k)th register; and a (n−k+1)th multiplier coupled to an output side of said (n−k)th register, said switching means in said first switching state supplying the output signal of said (n−k)th register to each of said second through (n−k)th adders via said (n−k+1)th multiplier and corresponding ones of said first through (n−k−1)th multipliers so that said second through (n−k)th adders respectively add the output signals of said first through (n−k−1)th registers and output signals of said corresponding ones of said first through (n−k−1)th multipliers and supplying the output signal of said (n−k)th register to said first adder via said (n−k+1)th multiplier so that said first adder adds one of the elements $D_1, D_2, \ldots, D_i, 0, \ldots, 0, D_j, \ldots, D_n$ and an output signal of said (n−k+1)th multiplier, said first through (n−k)th adders supplying added signals to said first through (n−k)th registers, respectively, said first through (n−k)th adders, said first through (n−k)th registers, said switching means in said first switching state and said first through (n−k+1)th multipliers carrying out a dividing step by a reciprocal polynomial G*(x) of a parity generating polynomial G(x) each time one of the elements $D_1, D_2, \ldots, D_i, 0, \ldots, 0, D_j, \ldots, D_n$ is supplied to said first adder, said parity generating polynomial G(x) being described by $$G(x) = (x-1) \cdot (x-a) \cdot \ldots \cdot (x-a^{n-k-1})$$
$$= x^{n-k} + a_1 \cdot x^{n-k-1} + a_2 \cdot x^{n-k-2} + \ldots + a_{n-k-1} \cdot x + a_{n-k},$$

where $\alpha$ is a primitive element of Galois Field $GF(2^m)$ and $a_1$ through $a_{n-k}$ are constants, said reciprocal polynomial G*(x) being described by $$G^*(x) = a_{n-k} \cdot x^{n-k} + a_{n-k-1} \cdot x^{n-k-1} + \ldots + a_1 \cdot x + 1,$$

a divided result of the dividing step by said reciprocal polynomial G*(x) being obtained as values in said first through (n−k)th registers, said switching means assuming said second switching state after the dividing step by said reciprocal polynomial G*(x) is carried out n times, said switching means in said second state supplying the output signal of said first register to each of said first through (n−k)th multipliers so that said second through (n−k)th adders add the output signals of said first through (n−k−1)th multipliers and said second through (n−k)th registers and added signals from said second through (n−k)th adders are respectively supplied to said first through (n−k−1)th registers, and the output signal of said (n−k)th multiplier is supplied to said (n−k)th register, said first through (n−k)th adders, said first through (n−k)th registers, said switching means in said second switching state and said first through (n−k+1)th multipliers carrying out a dividing step by said parity generating polynomial G(x) with respect to the values in said first through (n−k)th registers, a divided result of the dividing step by said parity generating polynomial G(x) being obtained as new values in said first through (n−k) registers, the parity signals $P_{i+1}, \ldots, P_{j-1}$ being obtained in said first through (n−k)th registers after the dividing step by said parity generating polynomial G(x) is carried out i times.

5. A parity signal generating circuit as claimed in claim 4 in which said first through (n−k)th multipliers respectively multiply coefficients $a_1$ through $a_{n-k-1}$, said (n−k)th multiplier multiplies the coefficient $a_{n-k}$ and said (n−k+1) multiplies a coefficient $1/a_{n-k}$.

6. A parity signal generating circuit as claimed in claim 5 in which said switching means comprises a first data selector for selectively supplying to said first through (n−k)th multipliers the output signal of said (n−k+1)th multiplier in said first switching state and the output signal of said first register in said second switching state, (n−k) second data selectors, an L-th second data selector selectively supplying to an L-th register the output signal of an L-th adder in said first switching state and the output signal of a (L+1)th adder in said second switching state, where L=1, 2, ..., (n−k−1), a (n−k)th second data selector selectively supplying to said (n−k)th register the output signal of said (n−k)th adder in said first switching state and the output signal of said (n−k)th multiplier in said second switching state, and (n−k−1) third data selectors, an M-th third data selector selectively supplying to a (M+1)th adder the output signal of an M-th register in said first switching state and the output signal of a (M+1)th register in said second switching state, where M=1, 2, ..., (n−k−1).

* * * * *